United States Patent [19]
Simmons et al.

[11] Patent Number: 5,210,936
[45] Date of Patent: May 18, 1993

[54] METHOD AND APPARATUS FOR THE EXCISE AND LEAD FORM OF TAB DEVICES

[75] Inventors: Richard L. Simmons, Jonestown; James D. Wehrly, Jr.; Michael J. Bertram, both of Austin, all of Tex.

[73] Assignee: Microelectronics And Computer Technology Corporation, Austin, Tex.

[21] Appl. No.: 817,214

[22] Filed: Jan. 6, 1992

[51] Int. Cl.⁵ .................... H01R 43/00; B23P 23/00
[52] U.S. Cl. .................... 29/827; 29/566.2; 29/566.3; 72/427; 72/428; 140/105; 140/147
[58] Field of Search .................... 29/827, 566.1, 566.2, 29/566.3; 72/427, 428; 174/52.4; 140/105, 147

[56] References Cited

U.S. PATENT DOCUMENTS

| | | | |
|---|---|---|---|
| Re. 28,582 | 10/1975 | Dammar. | |
| 2,997,907 | 8/1961 | Constantino | 83/635 |
| 3,417,643 | 12/1968 | Bennett | 83/146 |
| 4,064,917 | 12/1977 | Diaz | 140/105 |
| 4,103,718 | 8/1978 | Steigerwald | 140/105 |
| 4,361,173 | 11/1982 | Storimans | 140/1 |
| 4,371,012 | 2/1983 | Weresch | 140/105 |
| 4,390,598 | 6/1983 | Phy | 428/577 |
| 4,399,610 | 8/1983 | Moyer | 29/827 |
| 4,488,581 | 12/1984 | Stumpf et al. | 140/105 |
| 4,553,420 | 11/1985 | Fierkens et al. | 72/380 |
| 4,559,978 | 12/1985 | Glatzel | 140/147 |
| 4,602,661 | 12/1986 | Heller et al. | 140/105 |
| 4,625,772 | 12/1986 | Maskens | 140/105 |
| 4,627,159 | 12/1986 | Waldner | 29/827 |
| 4,633,920 | 1/1987 | Donovan et al. | 140/105 |
| 4,691,747 | 9/1987 | Sokolovsky | 140/147 |
| 4,763,401 | 8/1988 | Marinoni et al. | 29/368 |
| 4,787,426 | 12/1988 | Linker et al. | 140/147 |
| 4,816,427 | 3/1989 | Dennis | 29/827 X |
| 4,829,669 | 5/1989 | Nakajima | 29/874 |
| 4,945,954 | 8/1990 | Wehrly, Jr. et al. | 140/105 |
| 5,065,504 | 11/1991 | Olla | 29/827 |

FOREIGN PATENT DOCUMENTS

| | | | |
|---|---|---|---|
| 61-69158 | 4/1986 | Japan | 29/827 |
| 3-22467 | 1/1991 | Japan | 29/827 |
| 3-129863 | 6/1991 | Japan | 29/827 |

OTHER PUBLICATIONS

"Comparative Compliance of Generic Lead Designs for Surface Mounted Components" by Robert T. Kotlowitz, AT&T Bell Laboratories, Whippany, N.J. 07981, pp. 7-19.

*Primary Examiner*—Carl J. Arbes
*Attorney, Agent, or Firm*—David M. Sigmond

[57] ABSTRACT

The excise and lead form of TAB leads bonded to an integrated circuit chip. Leads extending beyond a sidewall are clamped between a first clamp and a form anvil at a first portion spaced from the chip. The leads are also clamped between an excise/form tool and a second clamp at a second portion spaced further from the chip than the first portion. An excise blade cuts the leads outside the second portion. Then the excise/form tool, second clamp and excise blade move downwards in a curved path toward the chip to form a first lead corner against the form anvil and a second lead corner against the excise/form tool without splaying or galling the leads.

20 Claims, 12 Drawing Sheets

METHOD AND APPARATUS FOR THE EXCISE AND LEAD FORM OF TAB DEVICES

BACKGROUND OF THE INVENTION

1. Field of the invention

The invention relates to forming metal leads, and more particularly to flexible techniques for excising and forming metal leads bonded to an electronic device which extend over a sidewall of the device.

2. Description of Related Art

In the manufacture of integrated circuits, silicon wafers containing many individual integrated circuits are fabricated and then the wafers are cut into individual integrated circuit chips or die. The chips are subsequently packaged and interconnected to other electrical components. During packaging, electrically conductive metal leads can be bonded between a chip and an interconnect substrate to provide proper electrical interconnection between different chips.

One technique for providing conductive interconnecting metal leads is tape-automated-bonding (TAB). The leads can be fabricated on a continuous carrier film in which the tape is a laminate of copper and a plastic insulator and the leads are etched in the copper while on the plastic carrier using well known etching processes. Or an additive metal fabrication can be used. The film is normally perforated along the edges with sprocket holes for use in advancement and alignment of the carrier film. Individual chips can be electrically bonded to individual lead frames in the tape, for instance by laser bonding as described in U.S. Pat. No. 4,845,335, and the lead frames can be removed or excised from the carrier film. Usually it is necessary to bend or form the leads prior to bonding the outer lead ends to an interconnect substrate.

Conventional excise and lead form of TAB devices requires the design and fabrication of custom tooling for each device size and/or lead form geometry. These tools basically conform to punch and die technology where the device is forced through a cutting die to excise it from a TAB film strip, and then forced around a forming die to produce the lead form. See, for instance, U.S. Pat. Nos. 2,997,907; 3,417,643; 4,064,917; 4,361,173; 4,371,012; 4,488,581; 4,559,978; 4,625,772; 4,633,920; 4,691,747; 4,787,426; 4,945,954 and 5,065,504.

As the pitch for TAB devices decreases (8 mils or less) it becomes more difficult to maintain the outer lead pitch during the excise and lead form operation. During excise sequence the device is literally punched through a cutting die. The cutting allowance is either designed in with a one-piece cutting die or adjustable with a four-piece cutting blade matrix. If this cutting allowance is incorrect, burrs will form and often cause lead splay.

Once excised from the TAB film strip, the leads become cantilevered beams supported by the inner lead bond and often a dielectric support ring. These lead beams have a very small cross-sectional area as compared to their length, making them susceptible to bending. As these beams are forced around a forming die, they are bent closest to the supported end first and continually abraded down their length until the second or lower bend is formed, making it difficult to control the pitch at the other end. Keeper bars (strips of dielectric on the lead tips) are often used to prevent splay on fine pitch devices; however, they may require more complex form tooling and present other problems during outer lead bonding.

In addition, due to the tight tolerances required on fine pitch devices, the punches and dies must be customized for the exacting specifications of each TAB design. As a result, the tools are expensive, require long lead times to procure, are labor intensive and are time consuming to install and tune. Once on line, this is an effective and relatively fast (e.g., 6 to 8 seconds) method of excise and lead form. However, less static activities such as the research and development of TAB multichip modules may be hindered.

Needless to say, there is a need for an alternative approach to TAB excise and lead form that allows an inexpensive set of hard tooling to be used for a variety of chip sizes and beam tape geometries while minimizing splaying and galling of the leads.

SUMMARY OF THE INVENTION

An object of the present invention is provide excise and lead form of TAB devices with varying sizes and lead geometries without the need to change hard tooling. The present invention requires only a change in programming to accommodate a wide variety of devices.

A feature of the present invention includes a method of excising and forming a plurality of metal leads connected at inner ends to an electronic device which extend beyond a sidewall of the device, comprising the steps of clamping a first portion of the leads spaced from the device by contacting the top of the first portion with the bottom surface of a first lead clamp and the bottom of the first portion with the top surface of a form anvil, said form anvil further comprising a forming edge between the top surface and a forming surface on the side opposite the device, clamping a second portion of the leads further from the device than the first portion and spaced from the first portion by contacting the top of the second portion with the bottom surface of an excise/form tool and contacting the bottom of the second portion with the top surface of a second lead clamp, said excise/form tool further comprising a forming surface on the side facing the device and an outer surface on the side opposite the device and a forming edge between the bottom surface and the forming surface, and said second lead clamp further comprising an outer surface on the side opposite the device, wherein the outer surfaces of the excise/form tool and second lead clamp are aligned, excising a third portion of the leads further from the device than the second portion which extends beyond the outer surfaces of the excise/form tool and second lead clamp, thereby forming outer lead ends, moving the excise/form tool and second lead clamp downwards and toward the device until a fourth portion of the leads between the first and second portions is moved through an arc between the forming surfaces of the form anvil and the excise/form tool, thereby bending the leads at the forming edge of the form anvil to form a first corner in the leads and at the forming edge of the excise/form tool to form a second corner in the leads, and releasing the leads from the first lead clamp, form anvil, form/excise tool, and second lead clamp.

An advantage of the present invention is the use of one set of low cost tooling which can rapidly adapt to a variety of device sizes and lead form geometries.

Another advantage of the present invention is that the leads are not forced around a forming die, but rather are clamped and bent at two programmable points before excise and during lead form. This eliminates galling of the vertical leg and minimizes splaying at the outer lead ends.

A still further advantage of the present invention is that the vertical leg of the leads may contain a dielectric support bar, thereby decreasing the footprint of the device and allowing closer chip-to-chip spacing.

Still another advantage of the present invention is the ability to perform face-up and face-down lead forms with the same tooling.

These and other objects, features and advantages of the present invention will be further described and more readily apparent from a review of the detail Rd description and preferred embodiments which follow.

BRIEF DESCRIPTION OF THE DRAWINGS

The following detailed description of the preferred embodiments can best be understood when read in conjunction with the following drawings, wherein.

DETAILED DESCRIPTION OF THE PREFERRED EMBODIMENTS

While the present invention will be described for purposes of illustration only, by the excising and face-down forming of TAB leads bonded to an integrated circuit chip, the present invention is applicable to excising and forming other types of metal leads connected to electronic components.

Figure 1:
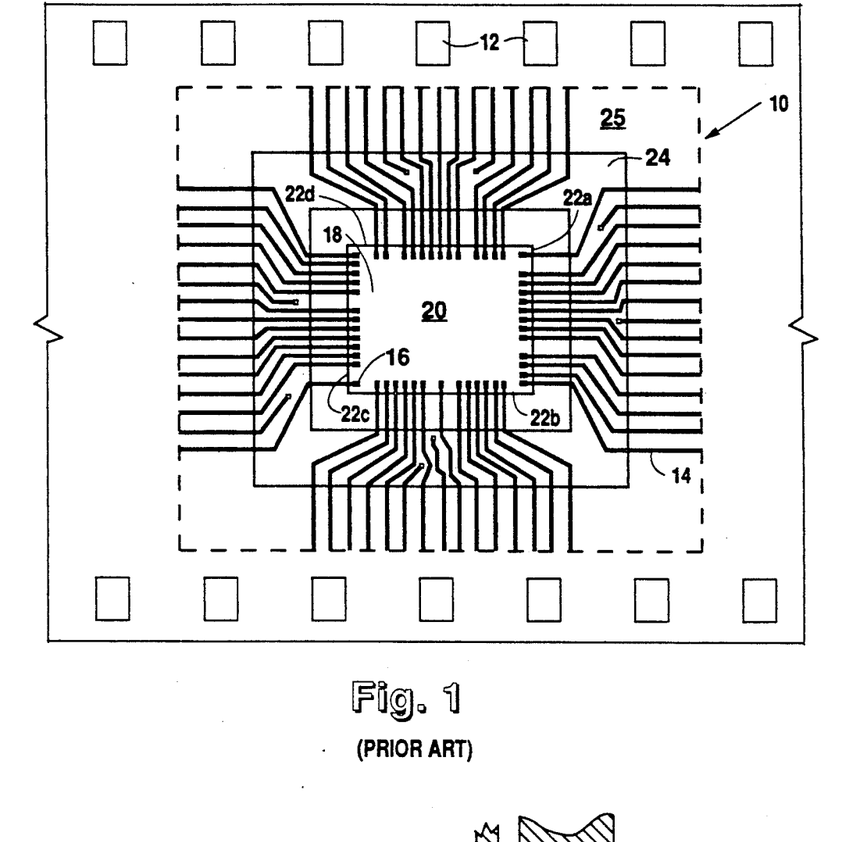
FIG. 1 shows a fragmentary enlarged elevational view of a prior art TAB tape with an integrated circuit chip bonded to inner ends of metal TAB leads.

Referring now to the drawings wherein depicted elements are not necessarily shown to scale and wherein like or similar elements are designated by the same reference numeral through the several views and, more particularly to FIG. 1, the reference numeral 10 generally indicates a leadframe of a tape-automated-bonding (TAB) tape having the usual sprocket holes 12 and a plurality of metal leads 14 bonded at inner ends 16 to pads on top surface 18 of integrated circuit chip 20 having four peripheral sidewalls 22a, 22b, 22c and 22d. Polyimide support ring 24 in window 25 may be necessary to keep leads 14 in place for assembly and test operations prior to bonding the outer lead ends to a substrate.

Figure 2:
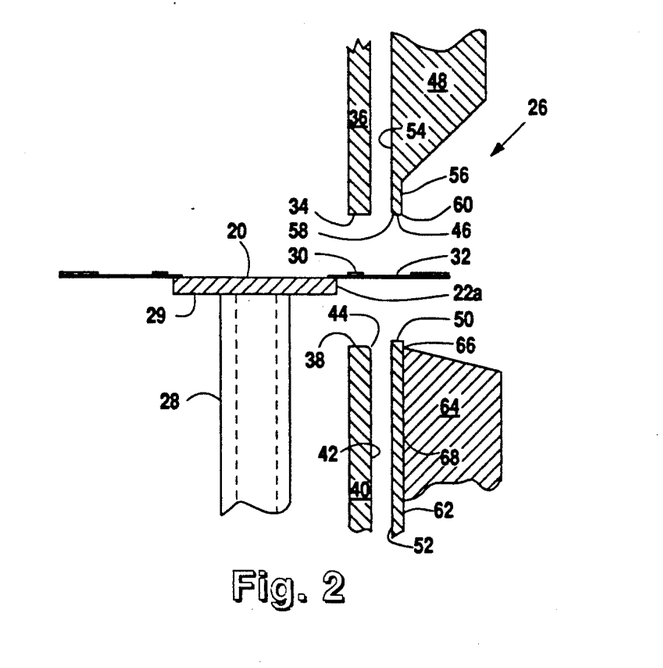
FIGS. 2-11 show successive stages in cross-section of the excise and lead form of TAB leads which extend beyond a sidewall of a chip in accordance with the present invention.

With reference now to FIG. 2, there is seen a cross-sectional view of system 26 for excising and forming TAB leads according to a particularly preferred exemplification of the invention. Unless otherwise noted, all surfaces are flat. Leadframe 10 can be fed into position using pins of a pin plate (not shown) as alignment marks for sprocket holes 12. Though not essential, a base may be positioned beneath chip 20. As may be seen, preferably vacuum pipette 28 beneath chip 20 is raised vertically and removably secures to the bottom 29 of chip 20 by applying a vacuum suction pressure. Pipette 28 also assures that chip 20 is level and serves as a reference point for other tooling. The leads 14 which extend beyond sidewall 22a comprise first portions 30 spaced from chip 20 and second portions 32 spaced further from chip 20 than first portions 30. The bottom surface 34 of first lead clamp 36 is positioned above first lead portions 30, and the top surface 38 of form anvil 40 is positioned below first lead portions 30. Form anvil 40 also includes forming surface 42 on the side opposite chip 20, and curved forming edge 44 between surfaces 38 and 42. Similarly, the bottom surface 46 of excise/form tool 48 is positioned above second lead portions 32, and the top surface 50 of a spring loaded second lead clamp 52 is positioned below second lead portions 32. Tool 48 also includes forming surface 54 on the side facing chip 20, outer surface 56 on the side opposite chip 20, curved forming edge 58 between surfaces 54 and 46, and cutting edge 60 between surfaces 46 and 56. Second lead clamp 52 contains an outer surface 62 on the side opposite chip 20. Excise blade 64 contains leading cutting edge 66 and sliding surface 68 adjacent outer surface 62 of clamp 52. Sliding surface 68 and outer surface 62 are aligned with outer surface 56, for example by a spring loaded nested cam mechanism (one course, one fine) in excise/form tool 48 which can precisely adjust the cutting allowance to provide near zero clearance excising without burrs.

Figure 3:
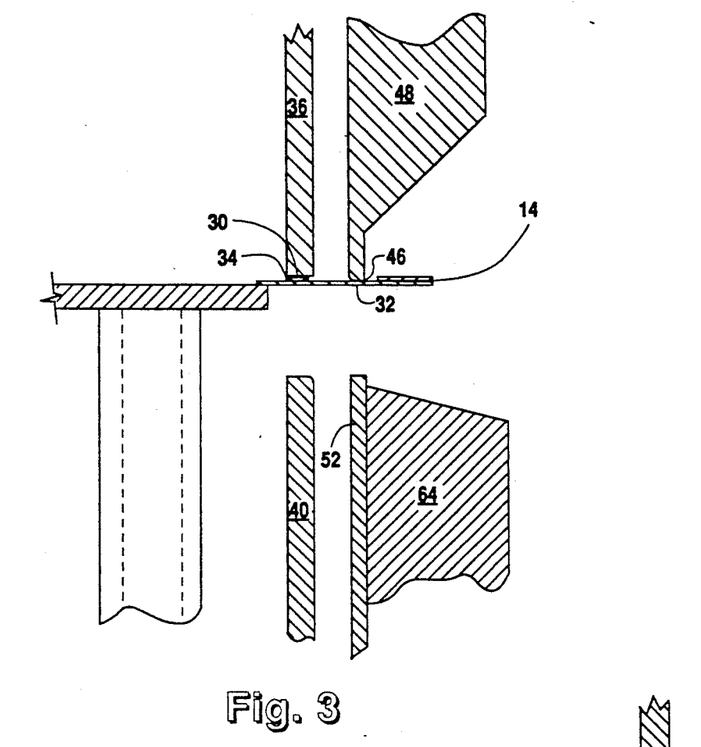
Figure 4:
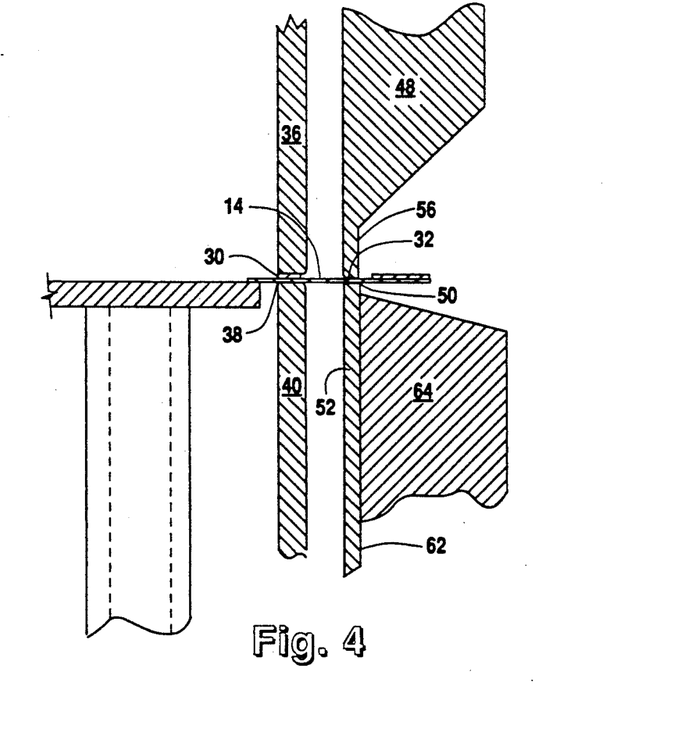

Referring now to FIGS. 3-4, the first lead portions 30 are clamped between first lead clamp 36 and form anvil 40, and the second lead portions 32 are clamped between excise/form tool 48 and second lead clamp 52. In FIG. 3, first lead clamp 36 and excise/form tool 48 are lowered vertically until their respective bottom surfaces 34 and 46 contact the tops of lead portions 30 and 32, respectively. In FIG. 4, form anvil 40 and second lead clamp 52 are raised vertically until their respective top surfaces 38 and 50 contact the bottoms of lead portions 30 and 32, respectively. Excise blade 64 is also raised vertically with second lead clamp 52 but does not yet slide or contact leads 14. Also, outer surfaces 56 and 62 are aligned and form a smooth coplanar surface.

Figure 5:
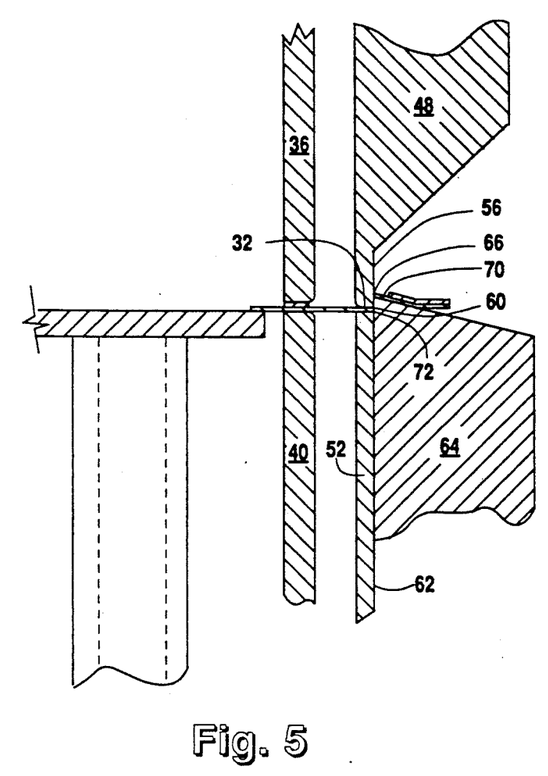

With reference now to FIG. 5, after the leads are clamped the excise operation takes place. First lead clamp 36, form anvil 40, excise/form tool 48 and second lead clamp 52 are held stationary while excise blade 64 moves upward in sliding contact with second lead clamp outer surface 62. Excise blade 64 forces cutting edges 60 and 66 against third lead portions 70 further from chip 20 than portions 32. Third lead portions 70 reside on the side of outer surfaces 56 and 62 opposite chip 20 and preferably adjacent to outer surfaces 56 and 62. As excise blade 64 continues to move upward and slidingly engages excise/form tool outer surface 56, cutting edges 60 and 66 slice through leads 14 to form outer lead ends 72.

Figure 6:
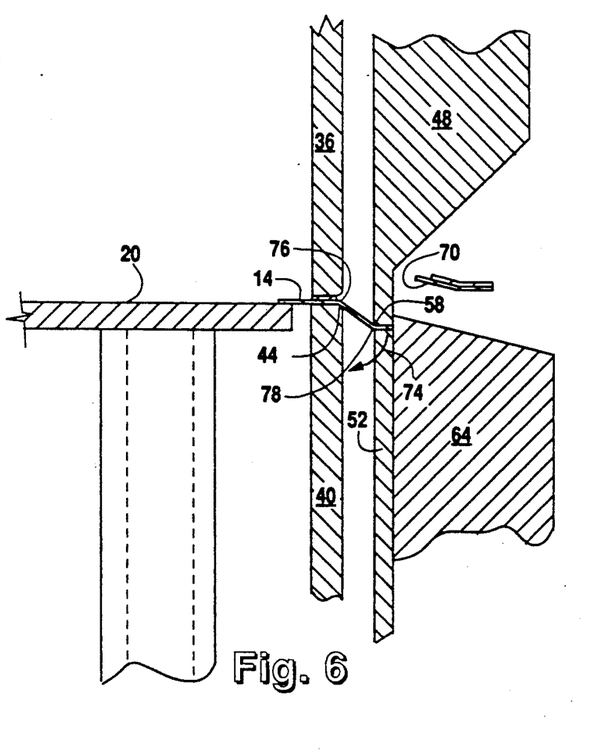
Figure 7:
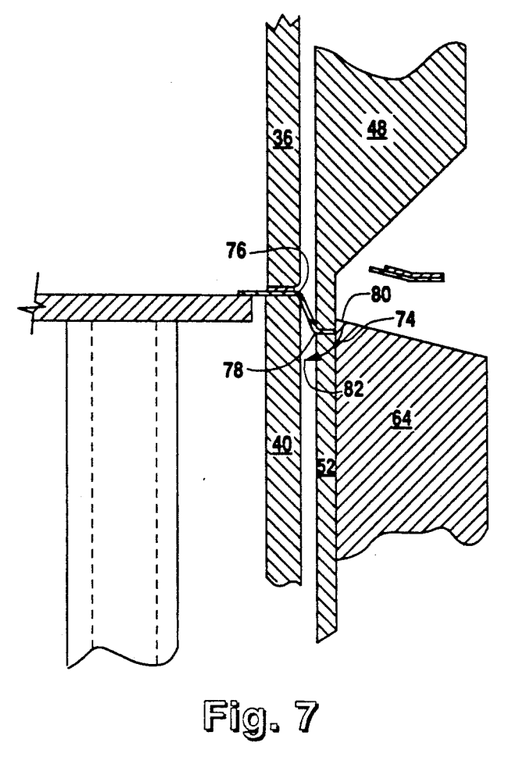
Figure 8:
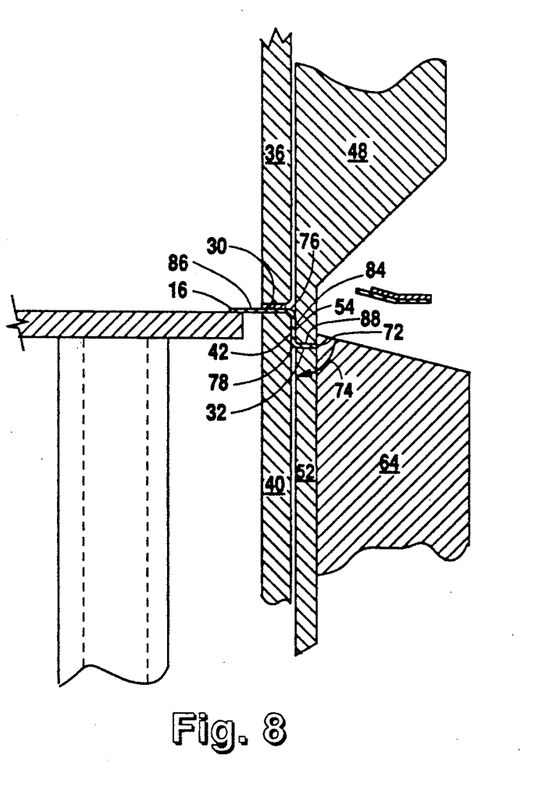

Referring now to FIGS. 6-8, the excised leads are bent into the specified form. In FIG. 6, first lead clamp 36 and form anvil 40 remain stationary while excise/form tool 48, second lead clamp 52 and excise blade 64 move together downwards and toward chip 20 in a programmed path, as depicted by arc 74. Leads 14 remain firmly clamped and are bent at first corners 76 and second corners 78. That is, first lead corners 76 are bent against forming edge 44 of form anvil 40 whereas second lead corners 78 are bent against forming edge 58 of excise/form tool 48. Since leads 14 are not forced around a forming die the abrasive action common to conventional forming is eliminated. Furthermore, the combination of lead clamping and non-abrasive forming minimizes the chance of lead splay, thereby allowing fine pitch devices to be lead formed without the use of a keeper bar. In FIG. 7, excise/form tool 48 and second lead clamp 52 continue the programmed motion in the direction of arc 74 to further bend corners 76 and 78. Arc 74 is preferably a curve with continually decreasing radius from starting point 80 to finishing point 82 to avoid pulling or stretching the leads as corners 76 and 78 are formed. A circularly curved arc 74 is also generally suitable but a straight-line arc 74 is not. In FIG. 8, fourth lead portions 84 between first and second lead portions 30 and 32, respectively, are moved through arc 74 and eventually sandwiched between and pressed against forming surfaces 42 and 54. This temporarily halts the motion of excise/form tool 48 and second lead clamp 52. For illustration purposes, lead corners 76 and 78 are formed at substantially 90 degree angles, lead portions 84 are substantially vertical, lead portions 86 between first corners 76 and inner lead ends 16 are substantially horizontal, and lead portions 88 (which constitute the outer lead bond foot) between second corners 78 and outer lead ends 72 are also substantially horizontal. However, it is understood that lead corners 76 and 78 may be formed at any angle between 0 degrees and 90 degrees. For instance, the motion of excise/form tool 48, second lead clamp 52 and excise blade 64 could halt at the position shown in FIG. 7, resulting in a greater leg angle and footprint. Furthermore, after the leads are released from the tooling some "spring-back" shall occur. The amount the leads springback depends on several factors such as the form radius and lead metallurgy.

Figure 9:
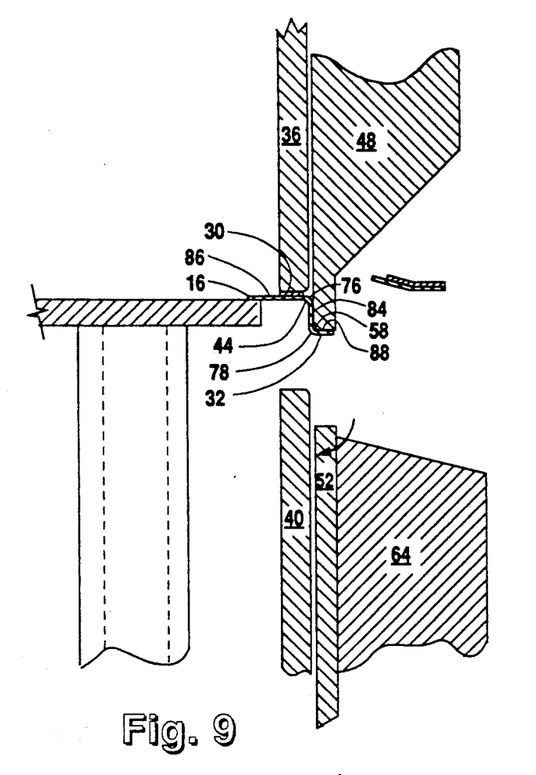
Figure 10:
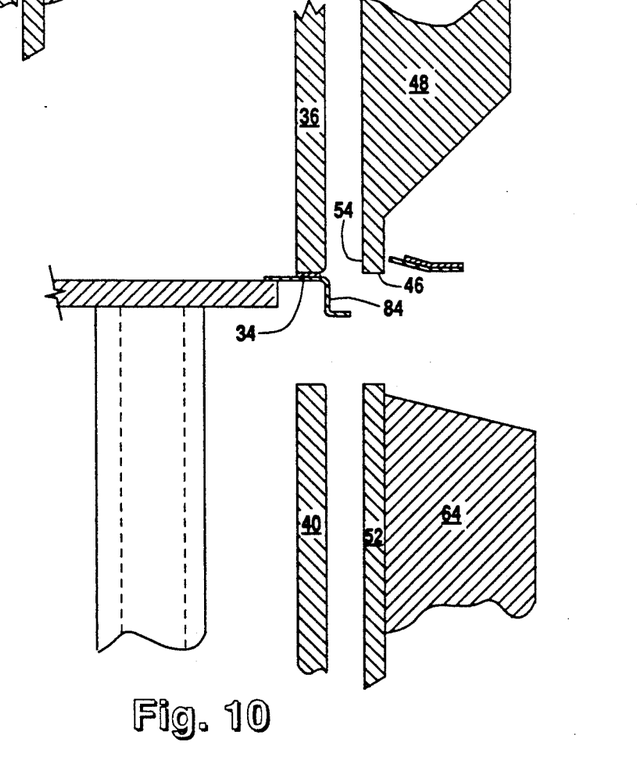
Figure 11:
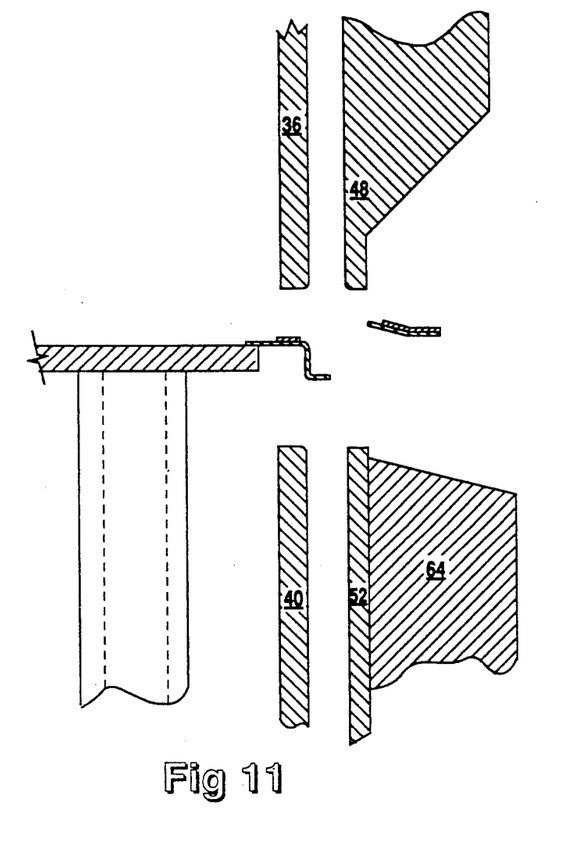

With reference now to FIGS. 9–11, the next step of the present invention is to release leads 14 from the first lead clamp 36, form anvil 40, excise/form tool 48, second lead clamp 52 and excise blade 64. In FIG. 9, excise blade 64 is retracted to its initial position relative to second lead clamp 52, and form anvil 40, second lead clamp 52 and excise blade 64 are lowered vertically while first lead clamp 36 and excise/form tool 48 remain stationary. In FIG. 10, excise/form tool 48, second lead clamp 52 and excise blade 64 are raised diagonally away from the leads while first lead clamp 36 and form anvil 40 remain stationary until bottom surfaces 34 and 46 align. This precludes forming surface 54 on excise/form tool 48 from pulling-up on lead portions 84 and possibly deforming the leads. In FIG. 11, first lead clamp 36 and excise/form tool 48 are raised vertically while form anvil 40, second lead clamp 52 and excise blade 64 remain stationary.

Figure 12:
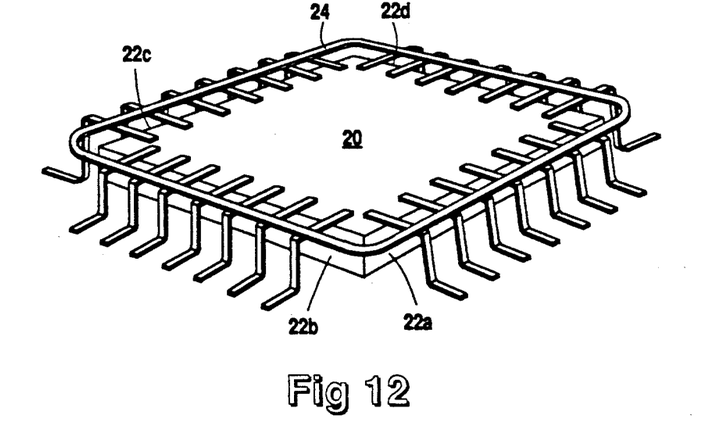
FIG. 12 shows a perspective view of a chip after the TAB leads on all sides have been excised and formed in accordance with invention.

It is important to note that only the leads extending beyond sidewall 22a of chip 20 have been excised and formed. Normally it will be necessary to excise and form the leads on all sides of the device, as best seen in FIG. 12. This can be accomplished by next rotating any holding fixture or pin plate (not shown) and vacuum pipette 28 by 90 degrees counterclockwise and repeating the aforementioned steps to excise and form leads 14 extending beyond sidewall 22b, and likewise for the leads 14 extending beyond sidewalls 22c and 22d. With one side excised and formed at a time, the total excise and form time for chip 20 is estimated on the order of 15–30 seconds. Alternatively, if desired, the leads 14 which extend beyond opposite sidewalls 22a and 22c could be excised and formed simultaneously using a separate first lead clamp 36, form anvil 40, excise/form tool 48, second lead clamp 52 and excise blade 64 for each sidewall. Thereafter, a pin plate and vacuum pipette 28 could be rotated 90 degrees, and the leads 14 extending beyond sidewalls 22b and 22d could also be excised and formed in a similar manner. However, simultaneously forming leads 14 which extend beyond adjacent sidewalls, e.g. sidewalls 22a and 22b, would not be preferred since the reduced tool size would limit the tool's flexibility.

Figure 13:
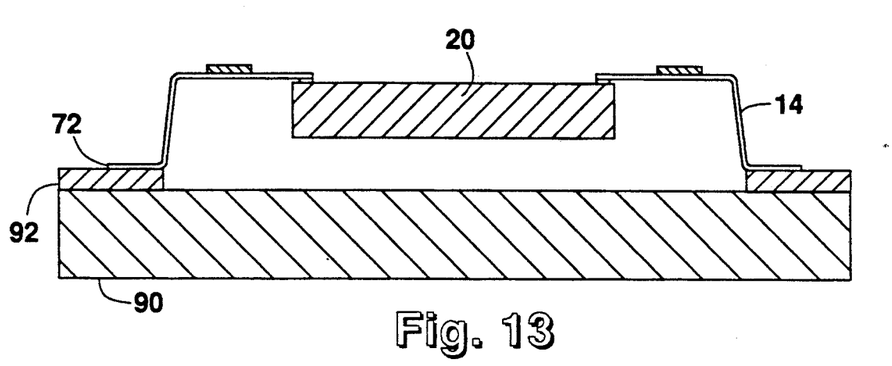
FIG. 13 shows a cross-sectional view of the chip in FIG. 12 surface mounted on a multi-chip module.

Referring now to FIG. 13, after each of leads 14 has been excised and formed, chip 20 can be surface mounted on any interconnect media common to TAB such as a multi-chip module copper/polyimide substrate 90 by bonding outer lead ends 72 to bonding pads 92.

The positions and movements of vacuum pipette 28, clamp 36, form anvil 40, excise/form tool 48, clamp 52 and blade 64 can all be controlled by a programmable computer. This allows the TAB device to be excised at any desired point along the length of the leads and consequently the lead form may be placed at any desired distance from the edge of the chip. Programmability also allows the geometry of the lead form to be changed by simply changing the program without changing the hard tooling.

Because of this tooling flexibility, a variety of TAB devices can be excised and lead formed without the down time of changing and setting up new tooling. If a tooling change is needed, a new set of tooling with smaller or larger blade width can be installed relatively quickly. This is due to the simplicity of a one sided design in comparison to a four sided punch and die set.

It should also be noted that the width of the cutting and forming blades determines which devices can be excised and lead formed. These blades must be able to span the width of the outer leads of the device, yet fit within the dielectric window of the tape. For example, an excise blade width of 0.400 inches can be programmed to excise and lead form any TAB device with an outer lead width (width of one side of the outer lead footprint) of less than 0.400 inches and a dielectric window of greater than 0.400 inches.

PROTOTYPE APPARATUS

With reference now to FIGS. 14–18, a prototype apparatus generally designated 100 was constructed by the Applicant to excise and lead form TAB devices in accordance with the present invention. It is understood that this example is meant to illustrate and not to limit the invention, the scope of which is defined solely by the appended claims.

Figure 14:
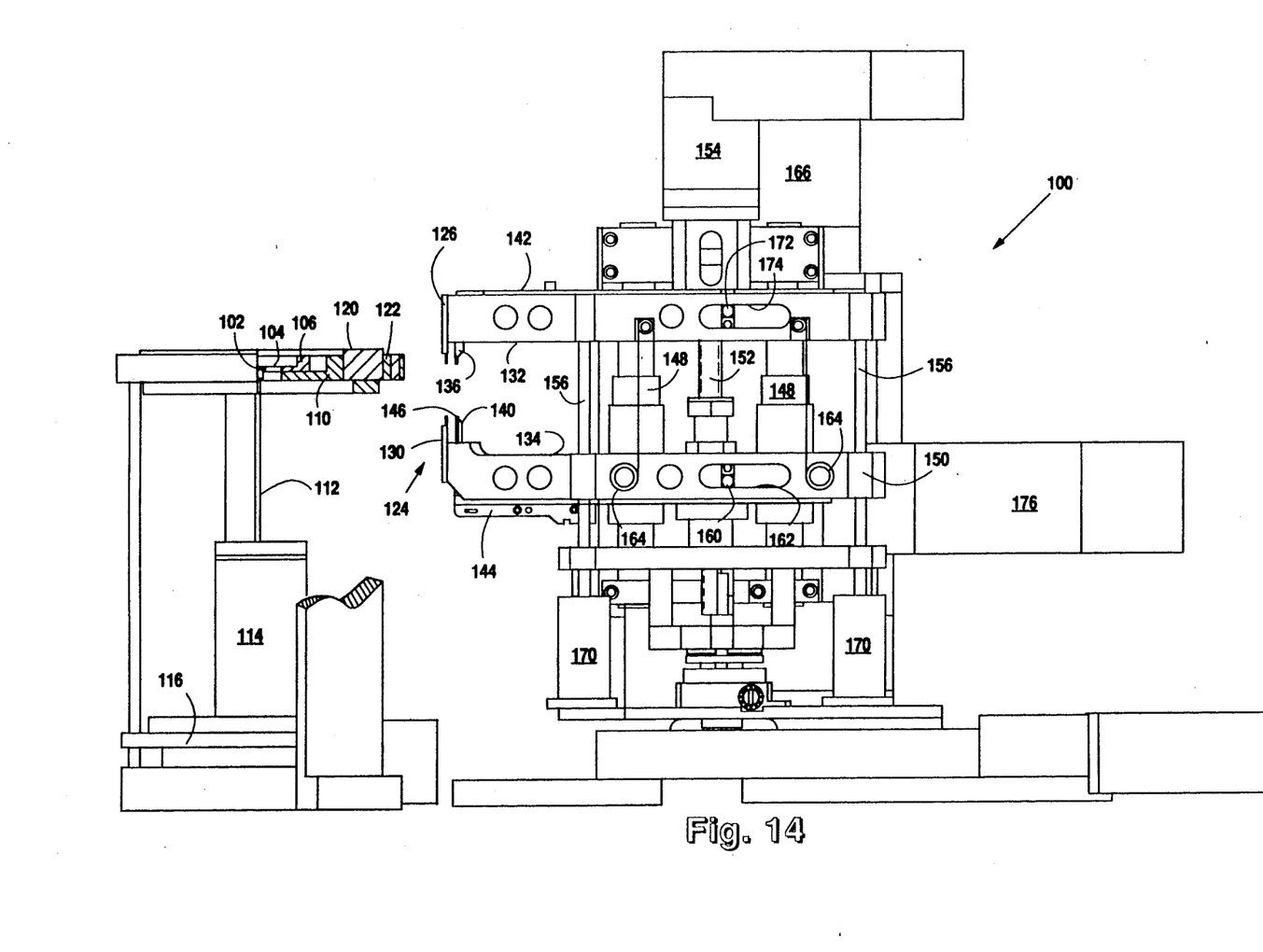
FIGS. 14-16 show side views of a prototype apparatus constructed in accordance with the present invention.

Referring now to FIG. 14, there is seen a side view of apparatus 100 with the jaws open and the leads retracted from the jaws. Device 102 with bonded TAB leads 104 is held by carrier 106. Carrier 106 is positioned in adapter plate 110 which may be removed and replaced to allow for varying sizes of carriers and devices. The bottom of device 102 is held by vacuum pipette 112 which may be raised or lowered by linear stage 114 to compensate for varying thicknesses. Linear stage 114 is attached to rotary stage 116 to provide rotation when rotary stage 116 is activated. Turntable 120 rotates in radial bearing 122 via a system of timing belts and pulleys 123 (shown in FIG. 18) when rotary stage 116 is activated. The timing belt system provides a means of device rotation (for excise and forming adjacent sides of device 102) while the entire jaw assembly 124 is open but poised around the device. This reduces cycle time by eliminating the time needed to move jaw assembly 124 away from otherwise rotating obstructions the rotary stage 116 would contain in order to rotate device 102

Upper clamp blade 126 and lower clamp blade 130 are attached to upper clamp jaw 132 and lower clamp jaw 134, respectively. Excise/form tool 136 and excise blade 140 are attached to upper excise jaw 142 and lower excise jaw 144, respectively. Spring loaded lead clamp 146 slideably contacts excise blade 140 and is also attached to lower excise jaw 144.

Lower excise jaw 144 can move vertically with respect to the upper excise jaw 142 via linear bearings 148. This movement is actuated by a lead screw 152 when excise servo motor 154 is activated. (These components comprise what is commonly known as a programmable, linear stage.)

Lower clamp jaw 134 can move vertically with respect to upper clamp jaw 132 via linear bearings 150 sliding on shafts 156. This movement is actuated by lower actuator pin 160 (attached to lower excise jaw 144) contacting surface 162 of lower clamp jaw 134 when lower excise jaw 144 moves as previously described. Constant force springs 164 apply the force necessary to keep surface 162 in contact with lower actuator pin 160.

Both upper excise jaw 142 and lower excise jaw 144 can move vertically on a linear stage (not shown) when the vertical lead form servo motor 166 is activated. When excise jaws 142 and 144 are open, clamp jaws 132 and 134 and shafts 156 also move as described with shafts 156 sliding in bearings 170. This is made possible by upper actuator pin 172 (attached to upper excise jaw 142) contacting surface 174 of upper clamp jaw 132. The force required for this contact is provided by gravity.

Excise jaws 142 and 144 can move horizontally with respect to clamp jaws 132 and 134 on a linear stage (not shown) when horizontal lead form servo motor 176 is activated. This allows programming of the horizontal distance between upper clamp blade 126 and excise/form tool 136, which in turn dictates the horizontal distance between lower clamp blade 130 and excise blade 140.

Figure 15:
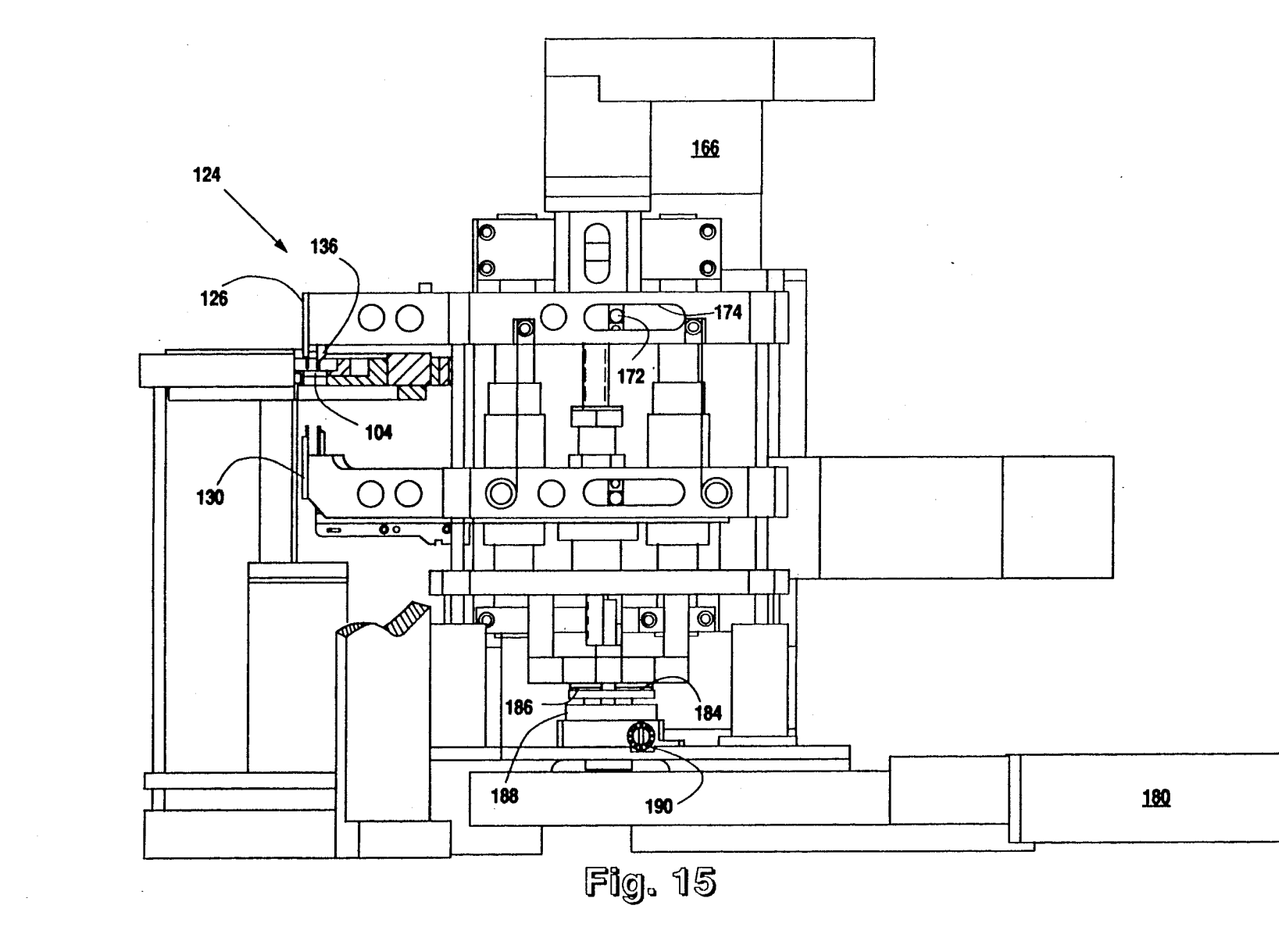

With reference now to FIG. 15, apparatus 100 is shown with the jaws open and the leads in contact with the top clamp and excise/form tool. Horizontal positioning of servo motor 180 is activated to move the entire jaw assembly 124 until clamp blades 126 and 130 are in the programmed horizontal position. Immediately thereafter, vertical lead form servo motor 166 lowers jaw assembly 124 until upper clamp blade 126 reaches the pre-set vertical clamp position; just touching a portion of leads 104 (or any support ring thereon). This position is attained when surface 184 of the clamp jaw assembly rests on surface 186 of vertical clamp position adjuster 188. This position is set by manually turning adjustment knob 190. Once this position is attained, the clamp jaw assembly stops moving and upper actuator pin 172 breaks contact with surface 174 of upper clamp jaw 132. The force (gravity) which once held surface 174 in contact with upper actuator pin 172 now holds surface 184 in contact with surface 186. The excise jaw assembly is further lowered so that excise/form tool 136 attains its programmed position; just touching a second portion of leads 104.

Figure 16:
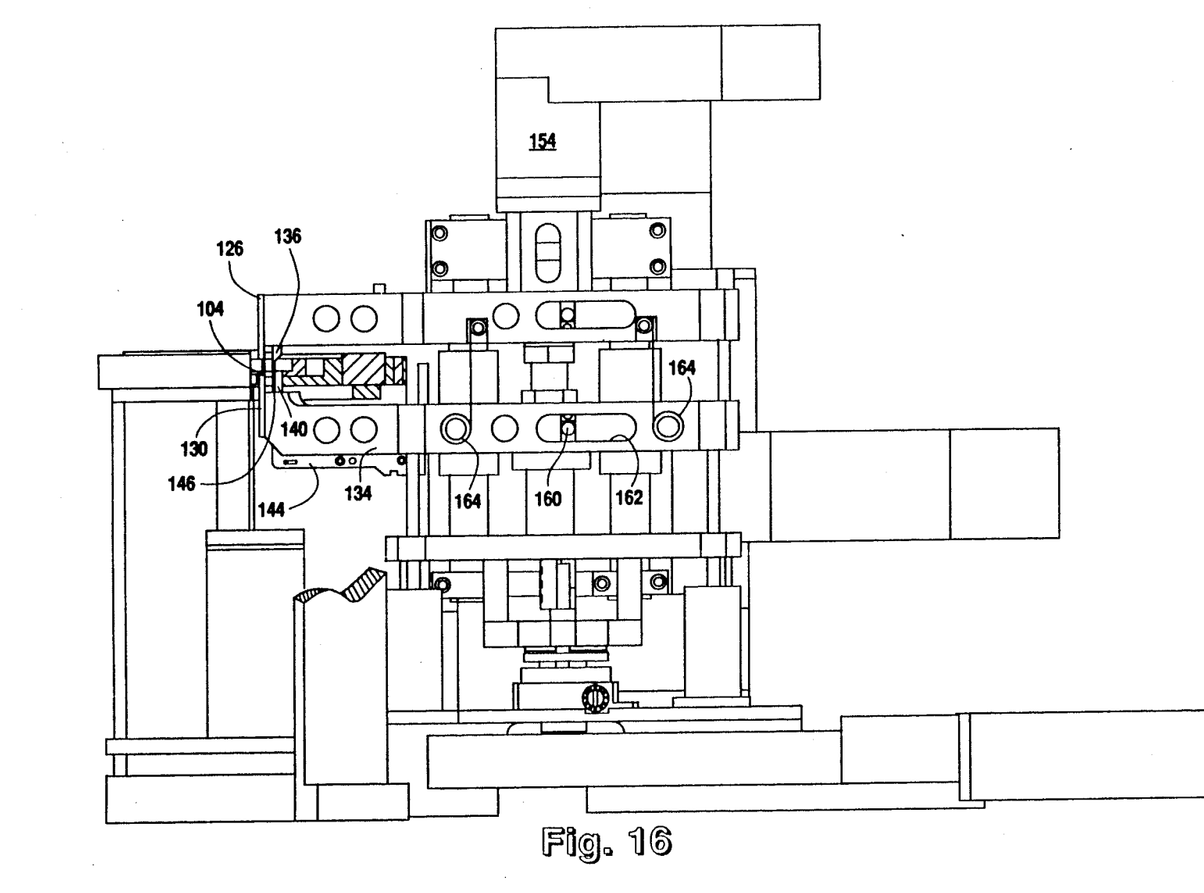

Referring now to FIG. 16, apparatus 100 is shown with the leads clamped, excised and ready to be formed. Excise/servo motor 154 is activated to raise lower excise jaw 144 and lower clamp jaw 134. As this occurs, lower clamp blade 130 clamps a portion of leads 104 against upper clamp blade 126, and lower actuator pin 160 breaks contact with surface 162. Constant force springs 164 which once held surface 162 in contact with lower actuator pin 160 provide lead clamping force between clamp blades 126 and 130. Lower excise jaw 144 continues to raise until a second portion of leads 104 is clamped between excise/form tool 136 and spring loaded lead clamp 146. Lower excise jaw 144 continues to move until a third portion of leads 104 is excised by excise blade 140 and excise/form tool 136. The excise jaw assembly can now be moved in a programmed path to form leads 104 by coordinating the motion of vertical and horizontal lead form servo motors 166 and 176, respectively.

Referring again to FIG. 14, after the leads are excised and formed apparatus 100 releases the leads and resets for another operation. Servo motor 154 lowers lower excise jaw 144 and lower clamp jaw 134 to release leads 104. The excise jaw assembly then moves at a 45 degree angle (up and right) via servo motors 166 and 176 to attain the depicted position. Immediately thereafter, servo motor 176 stops while servo motor 166 continues to raise jaw assembly 124 just enough to clear carrier 106. Then rotary stage 116 is activated to rotate turntable 120 via the pulley and belt system 123 so that an adjacent side of device 102 is presented for excise and lead form.

Figure 17:
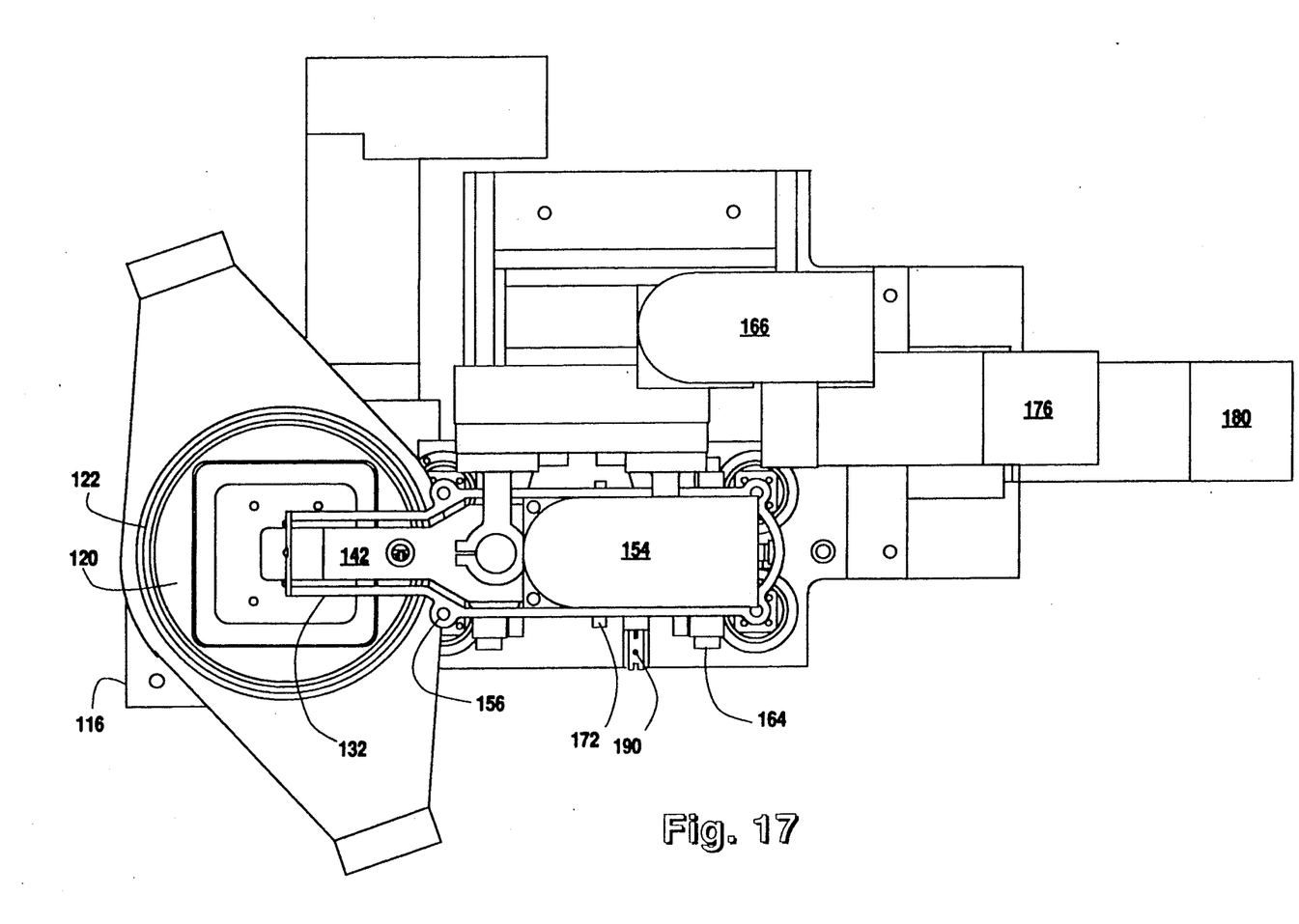
FIG. 17 shows a top plan view of the apparatus in FIGS. 14-16.
Figure 18:
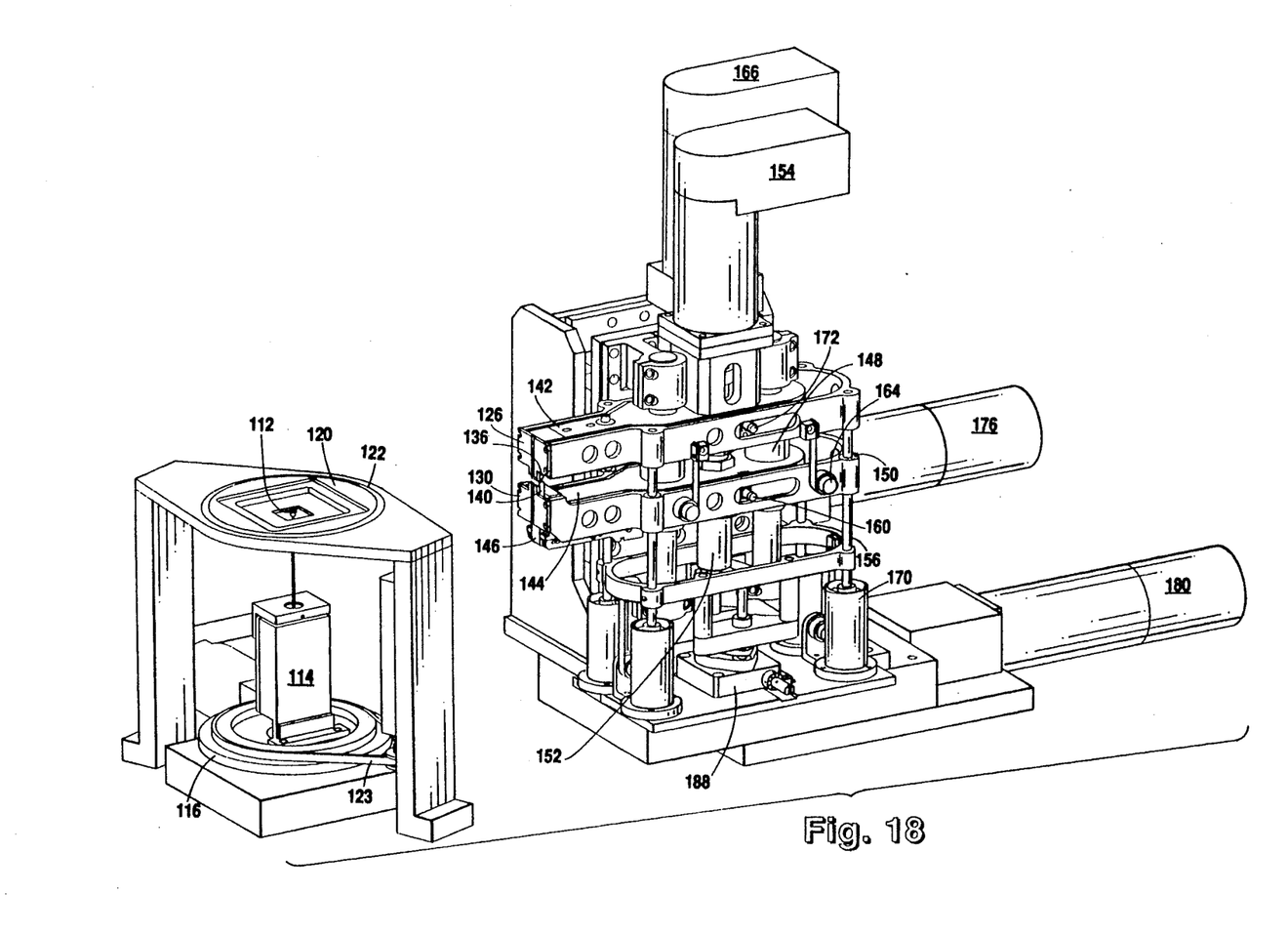
FIG. 18 shows an isometric view of the apparatus in FIGS. 14-16.

With reference now to FIGS. 17-18, apparatus 100 is further illustrated by a top plan view and an isometric view, respectively.

EXPERIMENTS PERFORMED

An experimental prototype (different from the previously described prototype) was designed and fabricated to test the programmable excise and lead form apparatus of the present invention. The experimental prototype was adapted to an existing programmable X-Y motion base (Hurco CNC milling machine model KM3P) and also utilized a programmable indexer, Haus model S5C to rotate the chips. All other tool positions were achieved with micrometer driven positioners and pneumatic cylinders with manually adjustable stops. Thus, the experimental prototype was not a stand alone unit but did perform the basic sequence of operations required.

Once the experimental prototype was assembled, several experiments were performed to test the quality of the excise. Using built in adjustments of the mechanism, the cutting allowance was adjusted to achieve a lead shear without burrs to near cross sectioning quality.

Devices with 328 leads on 4 mil (100 micron) pitch were chosen because of the relative degree of difficulty. The tie bars were removed from 10 of these devices using a tie bar punch before the devices were mounted in super 35 mm carriers, Camtex part C-053-01. Once mounted in the carriers, the devices were excised and face-up lead formed on the programmed experimental prototype.

Each device was then mounted in a separate fixture with the leads extending upward to facilitate measurement. Most leads maintained a lead pitch and planarity within 0.3 mils to 0.5 mils. Since approximately 27% of the pitch (or 1.10 mils) was the maximum acceptable displacement for high yield outer lead bonding on these devices, these results were acceptable.

The present invention, therefore, is well adapted to carry out the objects and attain the ends and advantages mentioned, as well as others inherent therein. While presently preferred embodiments of the present invention have been described for the purpose of disclosure, numerous other changes in the details of construction, arrangement of parts, compositions and materials selection, and processing steps can be carried out without departing from the spirit of the present invention which is intended to be limited only by the scope of the appended claims.

What is claimed is:

1. A method of excising and forming a plurality of metal leads connected at inner ends to an electronic device which extend beyond a sidewall of the device, comprising the steps of:
   clamping a first portion of the leads spaced from the device by contacting the top of the first portion with the bottom surface of a first lead clamp and the bottom of the first portion with the top surface of a form anvil, said form anvil further comprising a forming edge between the top surface and a forming surface on the side opposite the device;
   clamping a second portion of the leads further from the device than the first portion and spaced from the first portion by contacting the top of the second portion with the bottom surface of an excise/form tool and contacting the bottom of the second portion with the top surface of a second lead clamp, said excise/form tool further comprising a forming surface on the side facing the device, an outer surface on the side opposite the device and a forming edge between the bottom surface and the forming surface, and said second lead clamp further comprising an outer surface on the side opposite the device, wherein the outer surfaces of the excise/form tool and second lead clamp are aligned;
   excising a third portion of the leads further from the device than the second portion which extends beyond the outer surfaces of the excise/form tool and second lead clamp, thereby forming outer lead ends;
   moving the excise/form tool and second lead Clamp downwards and toward the device until a fourth portion of the leads between the first and second portions is moved through an arc between the forming surfaces of the form anvil and the excise/form tool, thereby bending the leads at the forming edge of the form anvil to form a first corner in the leads and at the forming edge of the excise/form tool to form a second corner in the leads; and
   releasing the leads from the first lead clamp, form anvil, form/excise tool, and second lead clamp.

2. The method as recited in claim 1, wherein after releasing the leads the first and second corners of the leads are formed at an angle between 0 degrees and 90 degrees, the portion of the leads between the device and the first corners is substantially horizontal, and the portion of the leads between the second corners and the outer lead ends is substantially horizontal.

3. The method as recited in claim 1, wherein the first lead clamp and form/excise tool are positioned above the leads and then lowered vertically before contacting the first and second portions of the leads, respectively, and the form anvil and second lead clamp are positioned below the leads and then raised vertically before contacting the first and second portions of the leads, respectively.

4. The method as recited in claim 1, wherein after the first and second portions of the leads are clamped the remaining steps are performed in sequence.

5. The method as recited in claim 4, wherein the leads are first released by the form anvil and second lead clamp, and then released by the first lead clamp and excise/form tool.

6. The method as recited in claim 1, wherein all movement is controlled by a computer.

7. The method as recited in claim 1, further comprising a dielectric support ring on the top of the first portion of the leads.

8. The method as recited in claim 1, further comprising removably securing the device to a base before clamping the leads.

9. The method as recited in claim 8, wherein the base is a vacuum pipette which removably secures to the bottom of the device by suction.

10. The method as recited in claim 8, wherein the device is a rectangular integrated circuit chip with four sidewalls and the leads are tape automated bonding leads with flat upper and lower surfaces which extend beyond all four sidewalls of the chip, and wherein prior to excising and bending the leads the leads are coplanar with the top of the chip and connected to a leadframe.

11. The method as recited in claim 10, wherein the leads which extend across the first sidewall are excised and formed, and further comprising
   rotating the base 90 degrees,
   repeating the steps of claim 1 to excise and form the leads which extend beyond the second sidewall,
   rotating the base 90 degrees,
   repeating the steps of claim 1 to excise and form the leads which extend beyond the third sidewall,
   rotating the base 90 degrees, and
   repeating the steps of claim 1 to excise and form the leads which extend beyond the fourth sidewall.

12. The method as recited in claim 10, wherein the leads which extend across the first sidewall and a third sidewall opposite the first sidewall are excised and formed simultaneously, and further comprising
   rotating the base 90 degrees, and
   repeating the steps of claim 1 to excise and form the leads which extend beyond the second and fourth sidewalls.

13. The method as recited in claim 1, wherein the excising is performed by an excise blade which is raised vertically and slidingly engages the outer surface of the second lead clamp before excising the third portion of the leads adjacent the outer surfaces of the excise/form tool and second lead clamp and slidingly engaging the outer surface of the excise/form tool.

14. The method as recited in claim 13, wherein the third portion of the leads is sliced by a leading cutting edge on the excise blade and another cutting edge between the bottom and outer surfaces of the excise/form tool.

15. The method as recited in claim 1, wherein the excise/form tool, second lead clamp and excise blade move downwards and toward the device in a curved path.

16. The method as recited in claim 15, wherein the curved path has a continually decreasing radius.

17. The method as recited in claim 1, wherein all of said surfaces are flat.

18. A method of excising and forming a plurality of flat metal TAB leads connected at inner ends to the top of an integrated circuit chip which extend beyond a sidewall of the chip, comprising the following steps in the sequence set forth:
   removably securing the chip to a base;
   clamping (i) a first portion of the leads spaced from the device by contacting the top of the first portion with the bottom surface of a first lead clamp and the bottom of the first portion with the top surface of a form anvil, said form anvil further comprising a forming edge between the top surface and a forming surface on the side opposite the device, and (ii) a second portion of the leads further from the device than the first portion and spaced from the first portion by contacting the top of the second portion with the bottom surface of an excise/form tool and contacting the bottom of the second portion with the top surface of a second lead clamp, said excise/form tool further comprising a forming surface on the side facing the device, an outer surface on the side opposite the device, a forming edge between the bottom surface and the forming surface, and a cutting edge between the bottom surface and the outer surface, and said second lead clamp further comprising an outer surface on the side opposite the device, wherein the outer surfaces of the excise/form tool and second lead clamp are aligned;
   excising a third portion of the leads adjacent the outer surfaces of the excise/form tool and second lead clamp by slidingly engaging an excise blade with the outer surfaces of the second lead clamp and excise/form tool, respectively, so that the third portion is sliced by a cutting edge on top of the excise blade and the cutting edge of the excise/form tool, thereby forming outer lead ends;
   moving the excise/form tool, second lead clamp and excise blade downwards and toward the device in a curved path while the first lead clamp and form anvil remain stationary, thereby bending the leads at the forming edge of the form anvil to start forming a first corner in the leads and at the forming edge of the excise/form tool to start forming a second corner in the leads;
   continuing moving the excise/form tool, second lead clamp and excise blade downwards and toward the device in the curved path while the first lead clamp and form anvil remain stationary until a fourth portion of the leads between the first and second lead corners is moved through an arc between the forming surfaces of the form anvil and the form/excise tool, thereby forming the first and second lead corners at an angle between 0 degrees and 90 degrees;
   releasing the leads from the first lead clamp, form anvil, form/excise tool, second lead clamp and excise blade; and
   releasing the chip from the base.

19. An apparatus for excising and forming a plurality of metal leads connected at inner ends to an electronic device which extend beyond a sidewall of the device, comprising the steps of:
   means for clamping a first portion of the leads spaced from the device by contacting the top of the first portion with the bottom surface of a first lead clamp and the bottom of the first portion with the top surface of a form anvil, said form anvil further comprising a forming edge between the top surface and a forming surface on the side opposite the device;
   means for clamping a second portion of the leads further from the device than the first portion and spaced from the first portion by contacting the top of the second portion with the bottom surface of an excise/form tool and contacting the bottom of the second portion with the top surface of a second lead clamp, said excise/form tool further comprising a forming surface on the side facing the device and an outer surface on the side opposite the device and a forming edge between the bottom surface and the forming surface, and said second lead clamp further comprising an outer surface on the side opposite the device, wherein the outer surfaces of the excise/form tool and second lead clamp are aligned;
   means for excising a third portion of the leads further from the device than the second portion which extends beyond the outer surfaces of the excise/form tool and second lead clamp for forming outer lead ends;
   means for moving the excise/form tool, second lead clamp and excise blade downwards and toward the device in a curved path until a fourth portion of the leads between the first and second lead corners is moved through an arc between the forming surfaces of the form anvil and the excise/form tool in order to bend a first corner in the leads at the forming edge of the form anvil and a second corner of the leads at the forming edge of the excise/form tool; and
   means for releasing the leads from the first lead clamp, form anvil, form/excise tool, and second lead clamp.

20. An apparatus for excising and forming a plurality of metal leads connected at inner ends to an electronic device which extend beyond a sidewall of the device, comprising:
   a base for releasably securing the device;
   a first lead clamp with a bottom surface;
   a form anvil with a top surface, a forming surface on the side opposite the base, and a forming edge between the top and forming surfaces;
   an excise/form tool with a bottom surface, a forming surface on the side facing the base, an outer surface on the side opposite the base, a forming edge between the forming and bottom surfaces, and a cutting edge between the bottom and outer surfaces;
   a second lead clamp with a bottom surface and an outer surface on the side opposite the base and aligned with the outer surface of the excise/form tool;
   an excise blade with a leading cutting edge which slidingly engages the aligned outer surfaces of the excise/form tool and the second lead clamp; and
   computer controlled means for
      clamping together the bottom surface of the first lead clamp with the top surface of the form anvil,
      clamping together the bottom surface of the excise/form tool with the top surface of the second lead clamp,
      moving the excise blade upwards in sliding engagement with the aligned outer surfaces of the excise/form tool and the second lead clamp,
      moving the clamped excise/form tool and second lead clamp along with the excise blade toward the clamped first lead clamp and form anvil in a curved path until the forming edge of the excise/form tool contacts the forming edge of the form anvil, and separating the first lead clamp, form anvil, excise/- form tool and second lead clamp without separating the second lead clamp from the excise blade.

* * * * *